United States Patent [19]
Oversluizen et al.

[11] Patent Number: 6,100,951
[45] Date of Patent: Aug. 8, 2000

[54] THIN-FILM SWITCHING ELEMENTS FOR ELECTRONIC DEVICES AND A METHOD OF MANUFACTURING THE SAME

[75] Inventors: Gerrit Oversluizen, Valkenswaard; Thomas C. T. Geuns, Weert, both of Netherlands; Brian P. McGarvey, Ballinasloe, Ireland; Steven C. Deane, Redhill, United Kingdom

[73] Assignee: U.S. Philips Corporation, New York, N.Y.

[21] Appl. No.: 08/909,913

[22] Filed: Aug. 12, 1997

[30] Foreign Application Priority Data

Sep. 30, 1996 [EP] European Pat. Off. .............. 96202720

[51] Int. Cl.[7] ............................. G02F 1/135; G02F 1/136
[52] U.S. Cl. .............................. 349/49; 349/43; 257/257; 257/30; 438/181; 438/299; 438/957
[58] Field of Search .................................. 349/49, 50, 51, 349/52, 43; 438/299, 735, 738, 180, 181, 701, 713, 900, 979; 257/30, 37, 38, 275, 1, 2, 333

[56] References Cited

U.S. PATENT DOCUMENTS

| | | |
|---|---|---|
| 5,142,390 | 8/1992 | Ohta et al. ................................ 349/52 |
| 5,253,092 | 10/1993 | Takahashi ................................ 349/52 |
| 5,859,678 | 1/1999 | Fujikawa et al. ......................... 349/52 |

FOREIGN PATENT DOCUMENTS

| | | | |
|---|---|---|---|
| 3-189624 | 8/1991 | Japan ..................................... 349/138 |
| 4-67022 | 3/1992 | Japan ........................... 349/FOR 119 |
| 6-75250 | 3/1994 | Japan ..................................... 349/187 |

*Primary Examiner*—Kenneth Parker

[57] ABSTRACT

Thin-film switching elements (20,21) of a display device or the like include a first electrode (22,23) on a substrate (11) and a layer of switching material (24,25) on the first electrode. These switching elements may be semiconductor PIN or Schottky diodes, or MIMs, or TFTs. The switching material is typically α-Si:H in the case of the semiconductor diodes and TFTs, and tantalum oxide or silicon nitride in the case of the MIMs. An auxiliary layer (28,29) of insulating material is provided between the first electrode (22,23) and the layer of switching material (24,25), leaving an edge (30,31) of the first electrode uncovered, so that the layer of switching material is connected to this edge only. The switching elements with this construction can be patterned using an inexpensive proximity printer, and have a low capacitance value, so counter-acting kickback and crosstalk which can occur in a switching matrix, e.g in the display of television pictures.

12 Claims, 9 Drawing Sheets

THIN-FILM SWITCHING ELEMENTS FOR ELECTRONIC DEVICES AND A METHOD OF MANUFACTURING THE SAME

BACKGROUND OF THE INVENTION

The invention relates to an electronic device, particularly but not exclusively a display device, comprising thin-film switching elements on a substrate, each switching element including a layer of switching material between first and second electrodes, the layer of switching material lying on the first electrode on the substrate. The invention also relates to the manufacture of such devices.

The invention is particularly, but not exclusively, advantageous in the field of active-matrix display devices, in which the substrate provides one of two parallel support plates of the display device; mutually facing faces of the parallel plates carry picture electrodes of the display device, the switching elements are accommodated between conductor tracks on said one plate and the picture electrodes of said one plate, and an electro-optical display medium is provided between the parallel support plates.

The electro-optical display medium is usually a liquid crystal in practice, but it may alternatively be an electrophoretic suspension or an electrochromic material. The device is called LCD device (for liquid crystal display device) in the former case. The picture electrodes may be arranged in a matrix of pixels which can be activated by means of conductor tracks and the switching elements provided. Such a device, is suitable for displaying television pictures or datagraphics. The switching elements may be PIN diodes, Schottky diodes, or TFTs (thin-film transistors) or alternatively MIMs. The switching material in the case of the PIN and Schottky diodes or TFTs is a semiconductor material, such as, for example, amorphous silicon passivated with hydrogen, $\alpha$-Si:H; the switching material in the case of the MIMs may be, for example, tantalum oxide (in combination with tantalum electrodes) or silicon-rich silicon nitride.

A display device of this kind, in which the switching elements are PIN diodes, is known from K. Nieuwesteeg et al., "2.8-inch PAL $D^2R$ Display for LCD Projector Use", Proceedings of the 13th International Display Research Conference, Aug. 31–Sep. 3, 1993, pp 529–532. The whole contents of this IDRC paper are hereby incorporated herein as reference material. To provide these switching elements, a first electrode is formed for each diode on one of the support plates, a layer of $\alpha$-Si:H is provided locally thereon, and a second electrode is formed on top. The two electrodes are strip-shaped and cross one another at right angles. Semiconductor material is present at the crossing point between the electrodes. The electrodes are 4 $\mu$m wide, and the diodes are square with a surface area of 16 $\mu m^2$.

The process of making the known display device is intricate and expensive. The conductor track patterns are imaged on a layer of photoresist which is provided on a layer of conductive material from which the conductor tracks are to be etched. Expensive photolithographic equipment is necessary, such as a projection printer, for realizing tracks which are 4 $\mu$m wide. Such equipment, however, is capable of exposing only a limited surface area in the range of, for example, 100 $cm^2$ to 500 $cm^2$ depending on the particular equipment and its cost. A number of exposure steps must be carried out next to one another, joined together with high accuracy, for realizing a picture display device with a larger surface area of, for example, 150 $cm^2$ or 900 $cm^2$. In addition, different photoresist masks must be used in this technique, which is known under the name of "stitching".

SUMMARY OF THE INVENTION

It is an aim of the present invention to provide a device structure which can be manufactured in a simple and inexpensive manner and which can have advantageous characteristics. According to the invention, an electronic device of the kind mentioned in the opening paragraph is for this purpose characterized in that an auxiliary layer of insulating material is provided between the first electrode and the layer of switching material, leaving only an edge of the first electrode uncovered, so that the layer of switching material is connected to this edge only of the first electrode.

Such a device according to the invention can be manufactured using inexpensive photolithographic equipment such as a proximity printer in which a photomask is placed at a small distance (for example approximately 100 $\mu$m) from the layer of photoresist to be exposed, whereupon the entire assembly is homogeneously exposed to a beam of parallel radiation. A pattern can be imaged on a large surface area in one step in this manner. No expensive photolithographic equipment is required, and the stitching technique need not be used. The fact that a proximity printer is not capable of forming patterns smaller than 10 $\mu$m is no problem given the design of the switching elements in accordance with the invention.

If the known display device were to be manufactured by means of a proximity printer, the conductor tracks would be 10 $\mu$m wide, so that its PIN diodes would be square with a surface area of 100 $\mu m^2$ each. An LCD device in which such large diodes are used will show undesirable capacitance effects. In practice, a pixel of such a device will have a capacitance of approximately 170 fF, and a PIN diode having a surface area of 100 $\mu m^2$ has a capacitance of approximately 35 fF when reverse biased. A voltage is applied to each pixel during writing of a television picture, which voltage must remain there until the next television picture is written. To achieve this, the diode is reverse biased after writing of each television picture until the next picture is written. Since the diode then has a high capacitance compared with the pixel, the voltage applied to the pixel will distribute itself over the pixel and the diode. This undesirable capacitance effect reduces the voltage across the pixel by approximately 20% in this example, which effect is called "kickback". It is also possible for crosstalk to occur between pixels owing to the small difference in capacitance between the diode and pixel, with the result that brightly lit elements in a television picture show an ugly smear. Schottky diodes and MIMs show similar unpleasant capacitance effects in practice.

However, in the manufacture of a device in accordance with the invention, an auxiliary layer of insulating material is formed on the first electrode, leaving only an edge of the first electrode uncovered, before the switching material is provided, and afterwards the switching material is provided both on this insulating auxiliary layer and on the uncovered edge of the first electrode. The switching elements are accordingly formed by an edge of the switching material which lies above the edge of the first electrode not covered by insulating material. These switching elements can be formed in a simple manner by means of a proximity printer such that they have a length of 10 $\mu$m, but a width which is much smaller. This width is only as large as the uncovered edge of the first electrode.

The first electrode may be covered initially with a layer of insulating material which is subsequently etched to uncover the edge and define the extent of the insulating auxiliary layer by means of an additional mask. An edge may be realized thereby having a width which is determined by the tolerance with which a mask can be aligned relative to the first electrode. A width of approximately 3 μm can be realized in practice in this manner. A PIN diode formed thereby then has a surface area of 30 μm². The capacitance effects discussed above are then strongly reduced.

Preferably, the layer from which the first electrode is formed is covered with a layer of insulating material on which a photoresist mask is then provided, and both layers are subsequently etched into a pattern defined by the mask, the layer of insulating material being removed from the edge of the first electrode by etching back the insulating material, thereby forming the auxiliary layer leaving an edge of the first electrode uncovered. The auxiliary layer may then leave an edge uncovered on opposite sides of the first electrode. This edge can be realized in a simple manner with a width of, for example, only 1 μm. When the first electrode is now fully covered with a layer of switching material, the two exposed edges of the first electrode will be covered with switching material. A pin diode formed in this manner will thus have a surface area of twice 10 μm² and a capacitance of no more than 7 fF. The capacitance effects mentioned above are then negligible in practice. The capacitance may be further reduced in that the switching material is provided on only one of the exposed edges of the first electrode.

Conductor tracks as well as the first electrodes may be formed from one and the same layer of conductive material on the substrate. Thus, the conductor tracks and the first electrodes may be defined by means of one and the same photoresist mask on the layer of insulating material which is provided over the entire surface of this layer of conductive material.

It is highly practical to etch the layer of insulating material isotropically and to etch the layer of conductive material anisotropically into the relevant patterns, the layer of insulating material being removed from the edge of the first electrode through underetching the mask using the isotropic etching, thereby defining the auxiliary layer on the first electrode.

The capacitance value of the switching elements may be further reduced when the layer of switching material is removed from on top of the auxiliary layer of insulating material formed on the first electrode, for example before a further layer such as a second electrode is formed on the layer of switching material. The layer of switching material is then present above the edge of the first electrode, but not above the layer of insulating material. This arrangement eliminates the parasitic capacitance formed by the first electrode, the layer of insulating material lying thereon, and the layer of switching material otherwise lying on the latter and forming a second electrode of this parasitic capacitance. This parasitic capacitance may have a value of approximately 5 fF. It can be sufficient in the manufacture of a PIN diode to remove the doped bottom layer of (n-type) semiconductor material from the auxiliary layer of insulating material on the first electrode.

It is also possible to use the uncovered edge of the first electrode as a localized dopant source for a localized diffusion into the layer of switching material. Thus, dopant of one conductivity type (e.g. n-type) may be diffused into the layer of switching material from the uncovered edge of the first electrode to provide the switching element with a doped region of the one conductivity type adjacent to the edge of the first electrode.

First electrodes with an uncovered edge structure in accordance with the present invention may be used to advantage in various thin-film switching elements, for example PIN diodes, Schottky diodes, TFTs and MIMs.

Thus, for example in one form, the switching elements may be PIN diodes having a multiple-layer α-Si:H film (of n-type, intrinsic and p-type α-Si:H switching material) on which a second electrode of the diode is formed. Preferably, at least the doped bottom layer of (e.g. n-type) α-Si:H is absent over the auxiliary layer of insulating material formed on the first electrode.

In another form, the switching elements may be thin-film transistors, wherein each transistor has a pair of spaced first electrodes formed on the substrate to provide source and drain electrodes of the transistor, the insulating auxiliary layer being formed on each spaced first electrode to leave uncovered facing edges of the source and drain electrodes. In this case, the subsequently-deposited layer of switching material (e.g. intrinsic α-Si:H or polycrystalline Si) provides a semiconductor channel region of the transistor between these uncovered facing edges of the source and drain electrodes. It is preferable to remove the semiconductor layer from the top of the auxiliary layer on the source and drain electrodes before depositing a gate dielectric and gate electrode.

BRIEF DESCRIPTION OF THE DRAWINGS

Embodiments of the invention will now be described, by way of example, with reference to the drawings, in which.

DETAILED DESCRIPTION OF THE PREFERRED EMBODIMENTS

Figure 1:
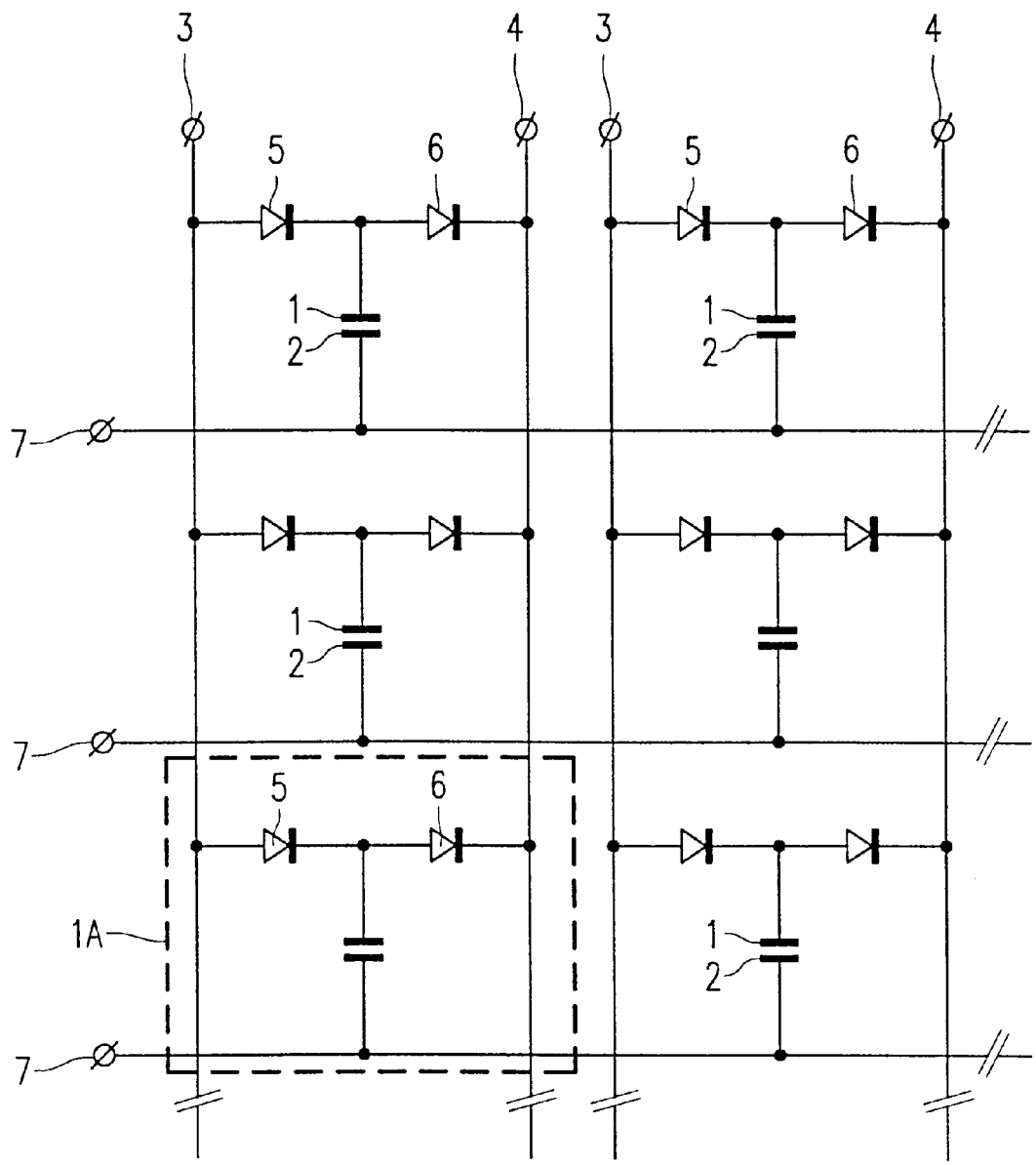
FIG. 1 is a circuit diagram of an example of a display device to which the invention is applied.

FIG. 1 shows a circuit diagram of an active-matrix LCD device. Two parallel glass support plates (11 and 12 in FIG. 2, between which a liquid crystal 10 is present) are provided with mutually opposed picture electrodes on their sides facing one another in such a display device. These picture electrodes (referenced 1 and 2 in FIG. 1, and 18 and 19 in the pixel section of FIG. 2) form a matrix of pixels.

Conductor tracks 3 and 4 arranged in columns are provided on one (11) of the support plates and connected to the picture electrodes 1 by means of thin-film switching elements, in the example PIN diodes 5 and 6. The other support plate 12 supports conductor tracks 7 arranged in rows and connected to the other picture electrodes 2.

A video signal is applied to the picture electrode 1 in each pixel via its respective diode 5 during writing of a television image with a positive voltage applied between the conductor tracks 3 and 7. After the pixels have been driven in this way, the diodes 5 are reverse-biased by means of a negative voltage applied between the conductor tracks 3 and 7. The drive voltage is thus retained between the picture electrodes 1 and 2. The pixels are reset by means of a positive voltage between the conductor tracks 7 and 4 before the pixels are again driven to display the next television picture.

Figure 2:
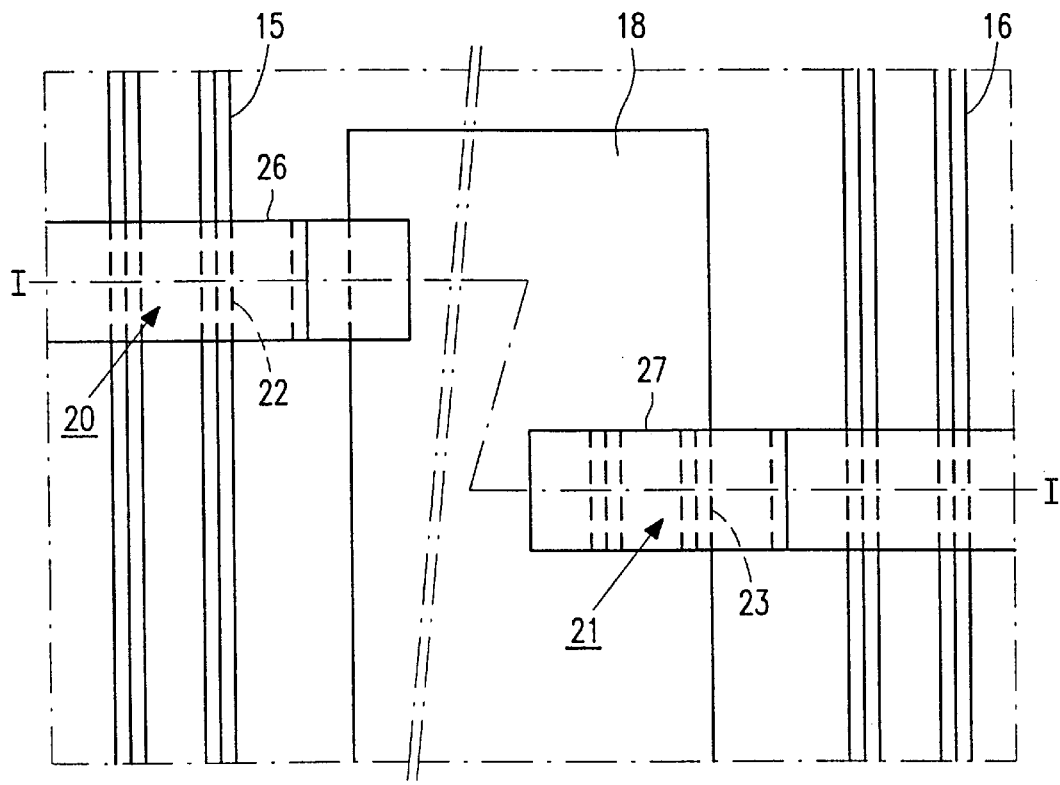
FIG. 2 is a diagrammatic plan view of the portion bounded with dotted lines 1A in FIG. 1, of a first embodiment of the display device in accordance with the invention.
Figure 3:
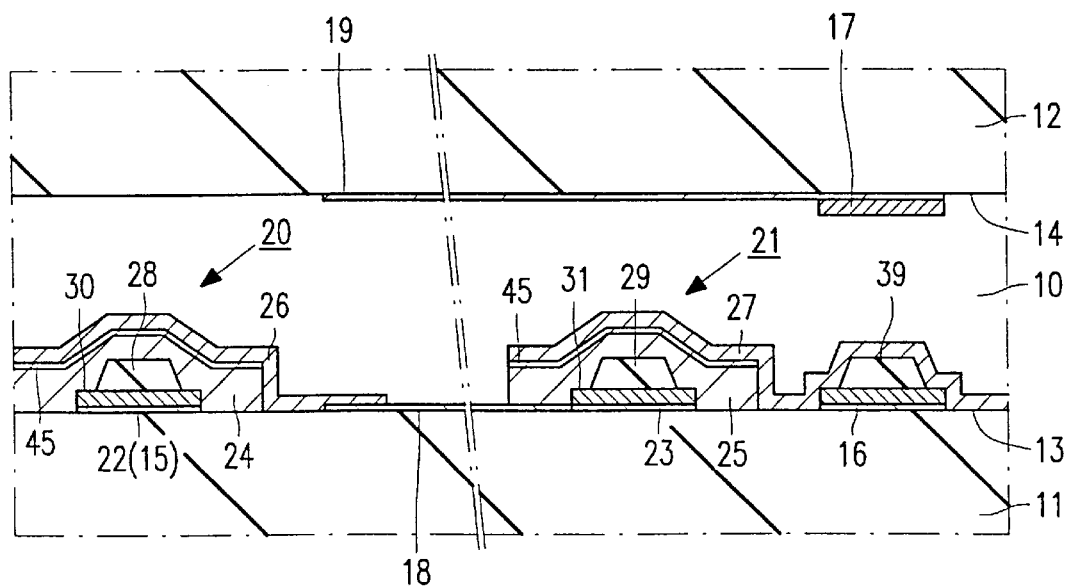
FIG. 3 is a diagrammatic cross-section taken on the line I—I in FIG. 2.

FIGS. 2 and 3 diagrammatically show a single pixel of the display device in plan view and in cross-section, respectively. The device comprises an electro-optical display medium 10 between two support plates 11 and 12. the plates 11 and 12 extend parallel to one another with an interspacing of approximately 5 $\mu$m and are provided with conductor tracks 15,16 and 17 on their sides 13 and 14 facing one another, and with picture electrodes 18 and 19 connected to said tracks. The picture electrodes 18 and 19 correspond to picture electrodes 1 and 2, respectively, in FIG. 1, and the conductor tracks 15, 16 and 17 correspond to the conductor tracks 3, 4 and 7, respectively, in FIG. 1. PIN diodes 20 and 21 are connected between the conductor tracks 15 and 16 and the picture electrodes 18 on the support plate 11.

The electro-optical display medium 10 is a liquid crystal in this example, but in an alternative device it may be an electrophoretic suspension or an electrochromic material. The display device is a liquid crystal display device. The switching elements in the example are PIN diodes, but they may alternatively be Schottky diodes or MIMs. The switching material is a semiconductor material, such as amorphous silicon passivated by hydrogen, $\alpha$-Si:H, in the case of the PIN and Schottky diodes, and tantalum oxide (in combination with tantalum electrodes) or a silicon-rich silicon alloy (for example silicon nitride) in the case of the MIMs.

Each PIN diode comprises a first electrode 22 and 23 carried on the plate 11, a layer of $\alpha$-Si:H 24 and 25 lying on the first electrode, and a second electrode 26 and 27 lying on the layer of semiconductor material. The first electrode 22 of the diode 20 in this example forms part of the conductor track 15.

An auxiliary layer of insulating material 28, 29 is provided between the first electrode 22, 23 and the layer of $\alpha$-Si:H 24,25, leaving only an edge 30,31 of the first electrode 22,23 uncovered, so that the layer of $\alpha$-Si:H 24,25 is connected to this edge 30,31 only. As will become apparent below, the display device as described can be manufactured by means of simple, comparatively inexpensive photolithographic equipment. The PIN diodes 20 and 21, when reverse biased, then have only a low capacitance value. If this were not the case, undesirable capacitance effects could occur during operation of the display device. A voltage is applied to each pixel during writing of a television picture and must remain there until the next television picture is written. To achieve this, the diode is reverse biased after writing of each television picture until the next picture is written. If the diode has a high capacitance value compared with the pixel, the voltage applied across the pixel will distribute itself over the pixel and the diode. This may reduce the voltage across the pixel by as much as 20%, which effect is called "kickback". Crosstalk is also apt to occur between pixels when the diode capacitance is too great, so that brightly lit elements in a television picture show an ugly smear.

FIGS. 4 to 9 show a few stages in the manufacture of the display device shown in FIGS. 2 and 3. The following layers are deposited in a usual manner in the following order on the support plate 11: an approximately 0.1 $\mu$m thick layer 35 of conductive, transparent ITO (indium-tin oxide), an approximately 0.1 $\mu$m thick layer 36 of tungsten, and an approximately 1 $\mu$m thick layer 37 of silicon oxide. A photoresist mask 38 is provided thereon, having a pattern corresponding to that of the conductor tracks 15 and 16 and the first electrodes 22 and 23. The layer 37 of silicon oxide is then isotropically etched into a pattern 28,29,39 etc. The layer of silicon oxide is also removed laterally over a distance of, for example, 1 $\mu$m below the photoresist mask 38 during this etching step, so underetching the mask 38. Then the tungsten layer 36 is anisotropically etched into a pattern. The conductor tracks 15,16 and the first electrodes 22, 23 are formed thereby. These are all covered with an auxiliary layer of silicon oxide 28,29,39 which, owing to the underetching which has taken place, leaves edges 30, 31, 40 of the conductor tracks 15, 16 and of the first electrodes 22, 23 uncovered, see FIG. 6.

After the photoresist mask 38 has been removed, a photoresist mask 41 is provided having a pattern corresponding to that of the picture electrodes 18. The ITO layer 35 is then etched into a pattern, whereby the picture electrodes 18 are formed.

The photoresist mask 41 is now removed, and a layer of semiconductor material is deposited. In this example, firstly an approximately 20 nm thick layer of p-type $\alpha$-Si:H (not shown) is provided with a doping concentration of approximately $10^{16}$ at/cc, then an approximately 0.4 $\mu$m thick layer 42 of intrinsic $\alpha$-si:H and an approximately 0.1 $\mu$m thick contact layer 43 of n-type doped $\alpha$-Si:H with a doping concentration of approximately $10^{20}$ at/cc are provided all in a usual manner. A photoresist mask 44 is formed on the layer of n-type $\alpha$-Si:H 42 with a pattern corresponding to that of the layers of semiconductor material 24,25. Then the layers of $\alpha$-Si:H are etched, to form the layers of semiconductor material 24,25 with a well-conducting top layer 45 on the first electrodes 22, 23.

After removal of the photoresist mask 44, an approximately 0.2 $\mu$m thick layer 46 of molybdenum or, for example, aluminium is deposited in a usual manner. A photoresist mask 47 is formed thereon with a pattern corresponding to that of the second electrodes 26,27. Then the layer 46 is etched into a pattern. By etching the layers of $\alpha$-Si:H, layers are formed on the first electrodes 22,23 wider than the second electrodes 26,27 which are to be formed. After the second electrodes 26,27 have been formed, the then exposed wider portions of the layers of $\alpha$-Si:H are removed, while using the second electrodes 26,27 as a mask.

The width of the edges 30,31 is determined by an underetching process in the method described. A width of approximately 1 $\mu$m can be realized in a simple and reproducible manner. The photoresist masks 38,41,44,47 used in the method may be formed by means of a proximity printer. This is capable of realizing photoresist masks with minimum dimensions of approximately 10 $\mu$m. The diodes 20,21 then have a length of 10 $\mu$m. Their surface areas, however, are no more than twice 10 $\mu m^2$. This means that the capacitance value of the diodes 20,21 in the reverse-bias state is approximately 7 fF, given the above layer thicknesses. The picture electrodes 18,19 in this example have a length of 300 µm and a width of 100 µm. A pixel then has a capacitance value of approximately 170 fF. The detrimental capacitance effects described above have become very weak in the display device described.

Figure 10:
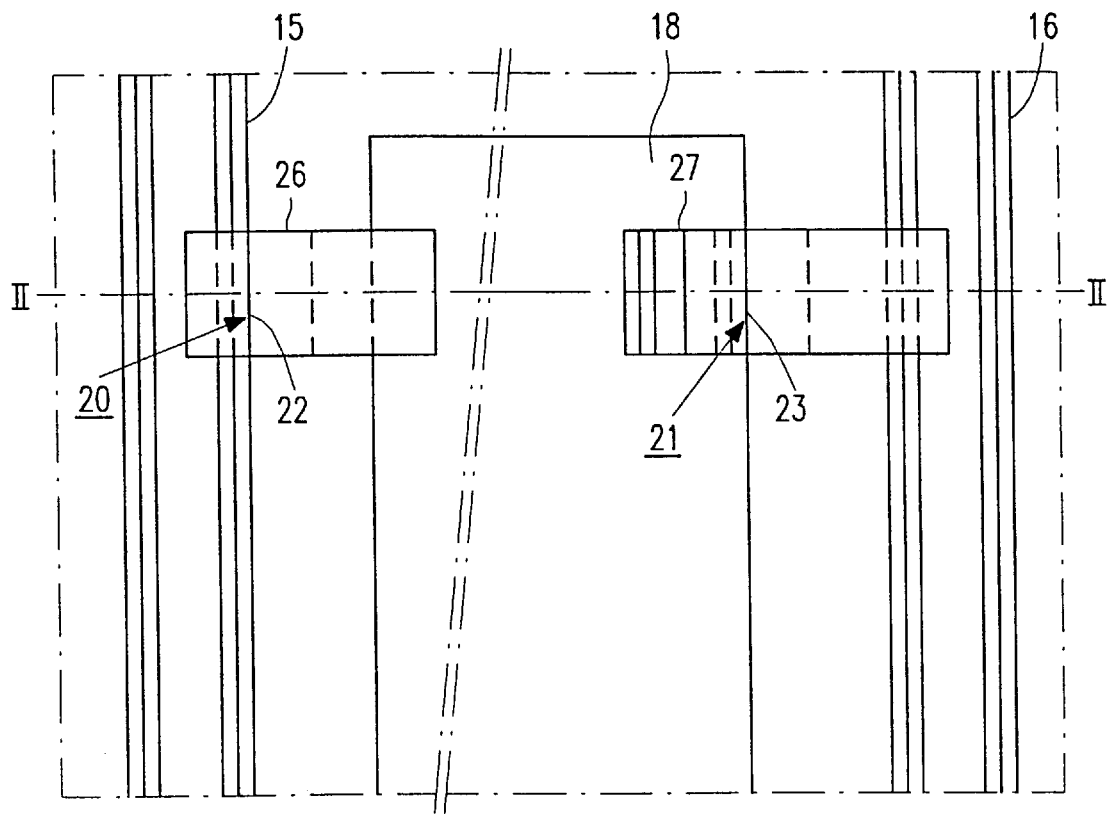
FIG. 10 is a diagrammatic plan view of the portion bounded by dotted lines 1A in FIG. 1, of a second embodiment of the display device in accordance with the invention.
Figure 11:
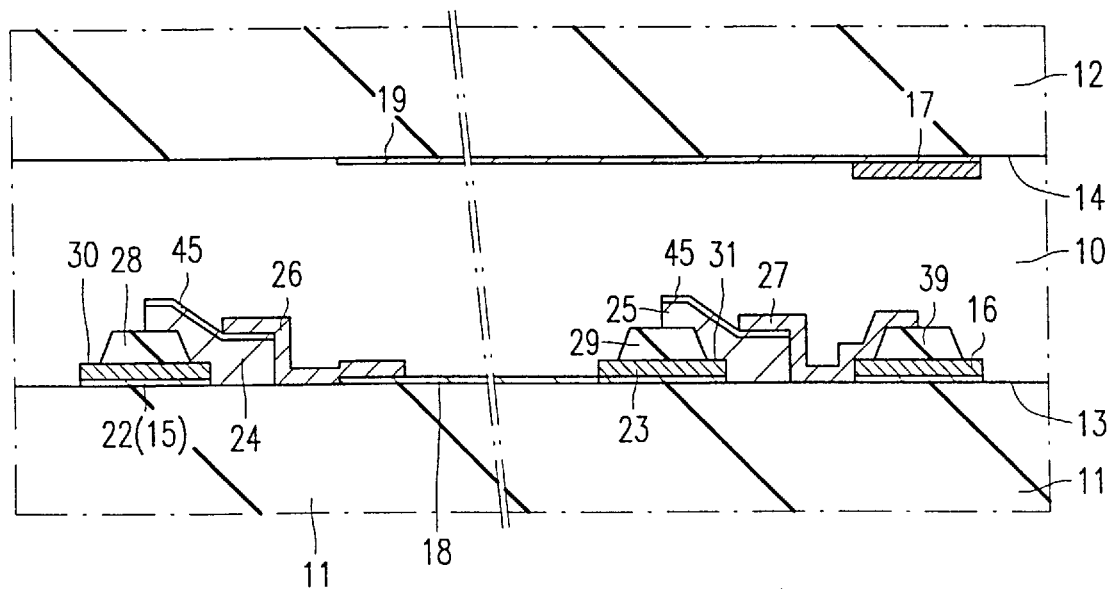
FIG. 11 is a diagrammatic cross-sectional view taken on the line II—II in FIG. 10.
Figure 12:
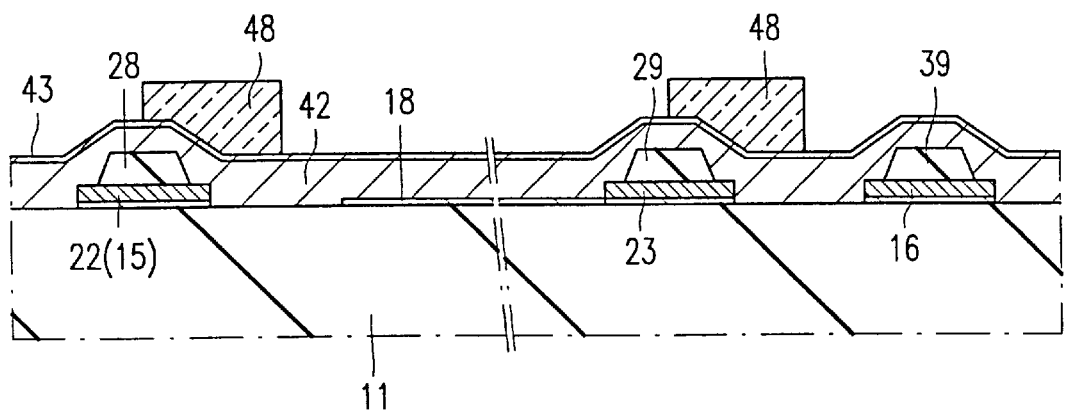
FIGS. 12 and 13 show in diagrammatic cross-section a few stages in the manufacture of the display device of FIGS. 10 and 11.
Figure 13:
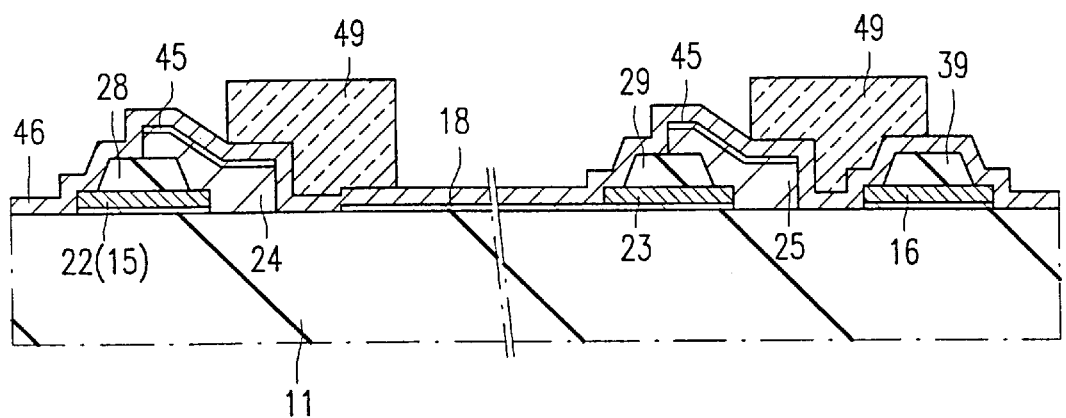

FIGS. 10 and 11 diagrammatically show a second embodiment of the display device in accordance with the invention in elevation and in cross-section, respectively, the same reference numerals as in the preceding description being used for corresponding components. In this second embodiment, the capacitance of the PIN diodes 20,21 is further reduced in that the layer of semiconductor material 24,45 is provided on only one of the two exposed edges 30,31 of the first electrode 22,23. It is apparent from FIG. 12 that a different pattern of photoresist mask 48 is used here for etching the layers of α-Si:H 42,43 into a pattern. FIG. 13 shows how a different photoresist mask 49 is also used for patterning the electrode layer 46. The diodes thus obtained now have a surface area of 10 µm each, and thus a capacitance in the reverse biased state of approximately 3.5 fF.

Figure 14:
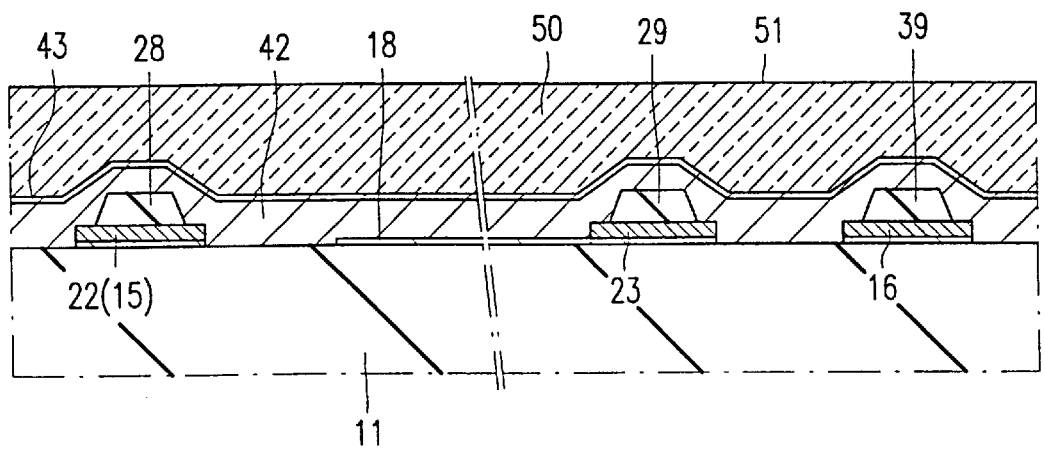
FIGS. 14 and 15 are diagrammatic cross-sections showing a few stages in the manufacture of a third embodiment of the display device in accordance with the invention.
Figure 15:
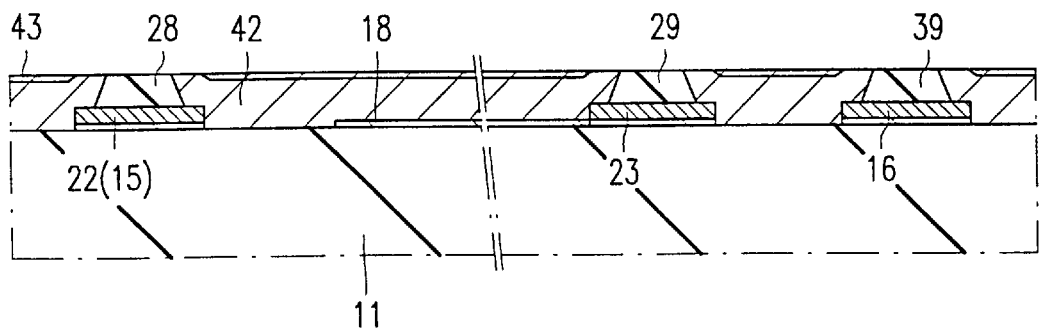
Figure 16:
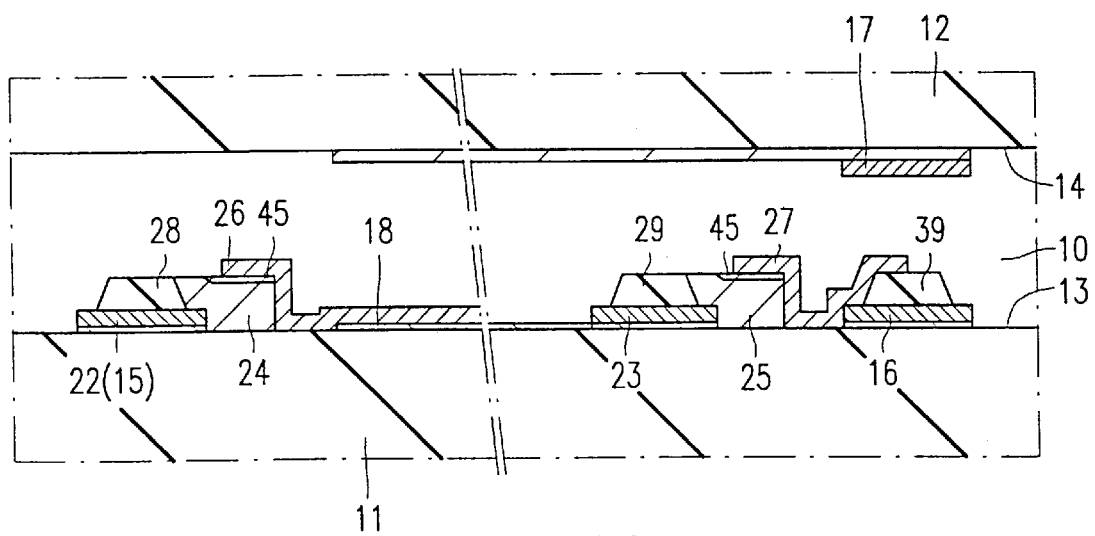
FIG. 16 is a diagrammatic cross-section of this third embodiment of the display device.

FIGS. 14 and 15 are diagrammatic cross-sectional views showing a few stages in the manufacture of a third embodiment of the display device, of which FIG. 16 is a diagrammatic cross-section. After the layers of α-Si:H 42,43 have been deposited, a planarising treatment is carried out in the following manner. A layer of photoresist 50 is deposited in a usual manner, to have a comparatively smooth surface 51. Etching then takes place with an etchant in which the photoresist and the layers of α-Si:H are etched at the same rate. The etching treatment is stopped when the silicon oxide of the layers 28,29 has just become exposed. The layer of semiconductor material 42 is then indeed present above the edge 30,31 of the first electrode 22,23, but no longer above the layer of insulating material 28,29. The second electrodes 26,27 are provided in the same manner as in the second embodiment of the display device shown in FIG. 11. The parasitic capacitance formed by the first electrode 22,23, the layer of insulating material 28,29 lying thereon, and the layer of semiconductor material 24,25 lying on top and forming the second electrode of this parasitic capacitance has been eliminated in this manner. This parasitic capacitance has a value of approximately 5 fF in the first embodiment of the display device shown in FIG. 3.

However, instead of the FIG. 15 stage, it is sufficient to remove the layer of n-type semiconductor material 45 from the auxiliary layer of insulating material 28,29 on the first electrode 22,23 before the second electrode 26,27 is formed in this example, in which PIN diodes are used as the switching elements. The parasitic capacitance is then removed to a sufficient extent. The contact layer 45 is strongly n-type doped but nevertheless forms a series resistance for the PIN diode in practice. This series resistance may be reduced when an additional, approximately 0.1 µm thick molybdenum layer (not shown in the Figures) is provided on the contact layer 45. The layer of molybdenum is deposited in this case after the deposition of the layer 43 of FIGS. 8 and 12 and before the photoresist mask 44,48 is provided, and is etched into a pattern by means of this photoresist mask 44, 48.

FIGS. 17 to 20 are diagrammatic cross-sectional views of a fourth embodiment (FIG. 21) of a device in accordance with the invention, showing a few stages in its manufacture. This embodiment illustrates several other modifications and variations which are possible in devices and methods in accordance with the present invention.

Figure 19:
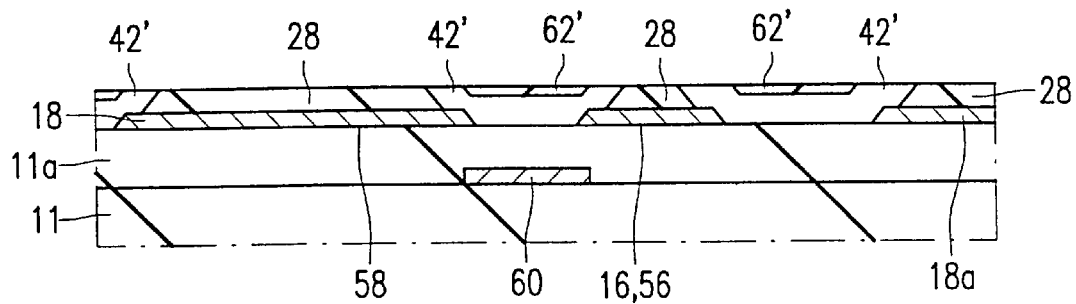
Figure 20:
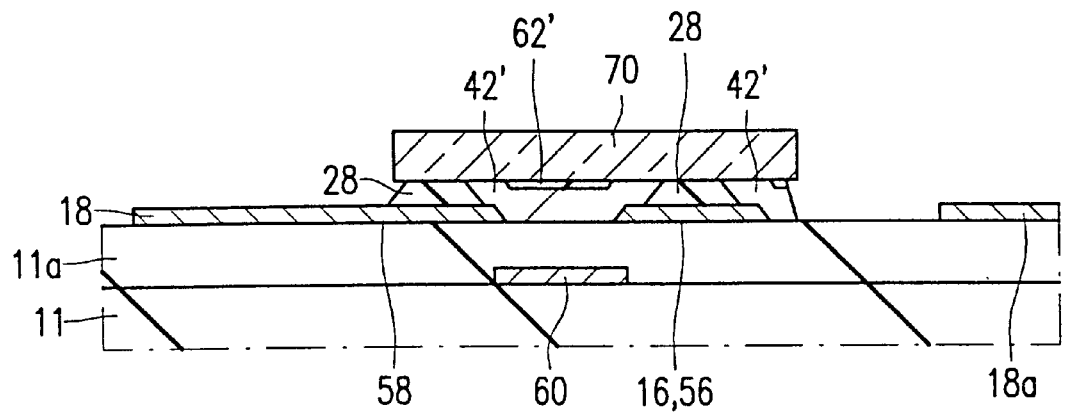

Instead of being a PIN diode, the thin-film switching element in FIG. 20 is a TFT. The use of TFTs as the switching elements in an active-matrix LCD device is well known, for example as described in U.S. Pat. No. 5,130,829 the whole contents of which are hereby incorporated herein as reference material. Capacitive kickback is a problem also in TFT-based active-matrix LCD devices. It is caused by capacitive discharging of the pixel by the parasitic capacitor formed by the overlap of the source and gate electrodes of the TFT. It can be particularly problematic when the overlap area is not uniform across the TFT matrix. This variation in gate-source parasitic capacitance can be reduced by adopting edge-only connection arrangements in accordance with the present invention. Such an arrangement is illustrated in FIGS. 17 to 21.

Generally light shields for the areas of the thin-film switching elements are provided on the plates 11 and 12 of a display device, for example as disclosed in the said IDRC paper. The inclusion of such light shields is not illustrated in FIGS. 2 to 16, but it is illustrated in FIGS. 17 to 21. Thus, in the arrangement illustrated by way of example in FIG. 21, this light-shield 60 is an opaque film pattern which is sandwiched between the plate 11 and a surface coating insulating layer 11*a* of, for example, silicon dioxide. Thus, the substrate on which the thin-film switching elements are carried includes this surface-coating layer 11*a*.

Figure 17:
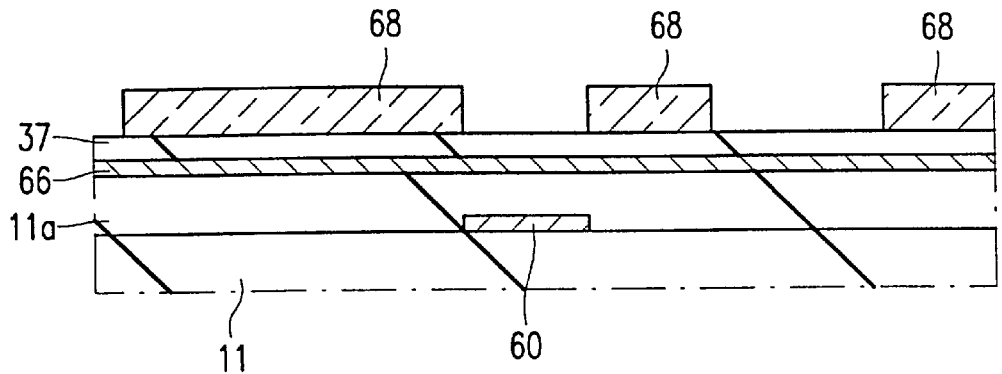
FIGS. 17 to 20 are diagrammatic cross-sections showing a few stages in the manufacture of a fourth embodiment of the display device in accordance with the invention.

In the embodiments of FIGS. 1 to 16, the picture electrodes 18 of ITO were formed from a different layer to that of the first electrodes 22,23 and tracks 16 on the substrate 11. Similarly in a TFT matrix, the (source and drain) first electrodes 56 and 58 and tracks 16 may be formed from one layer of conductive material (for example, chromium nitride or a molybdenum alloy), and the picture electrodes 18 may be formed from another layer of ITO. However, by way of example, FIGS. 17 to 21 illustrate an embodiment in which both the picture electrodes 18 and the (source and drain) first electrodes 56 and 58 and tracks 16 are formed from the same layer 66 of ITO. The area shown in the FIG. 21 cross-section illustrates a TFT switch area on the picture electrode 18 of one pixel, located beside an edge 18*a* of the picture electrode of a neighbouring pixel. After depositing the ITO layer 66 on the plate 11, the layer 37 of the insulating material (for example, silicon oxide) is then deposited, and a photoresist mask 68 is provided thereon for etch definition of the ITO pattern 16,18,56 and 58. The resulting structure at this stage is illustrated in FIG. 17.

Figure 5:
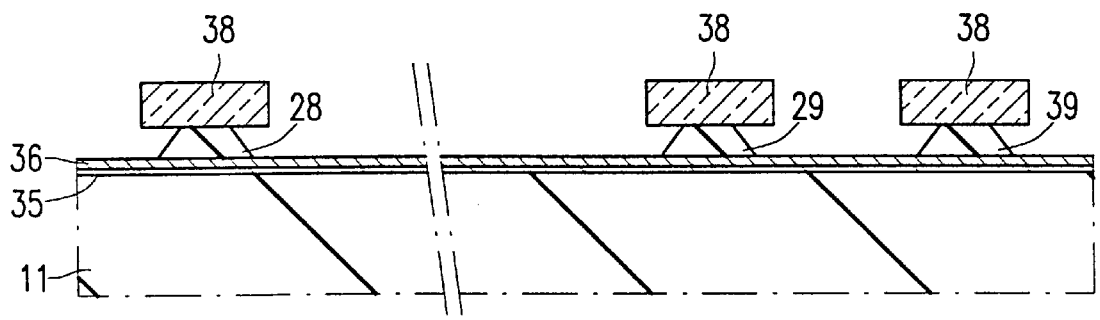
Figure 6:
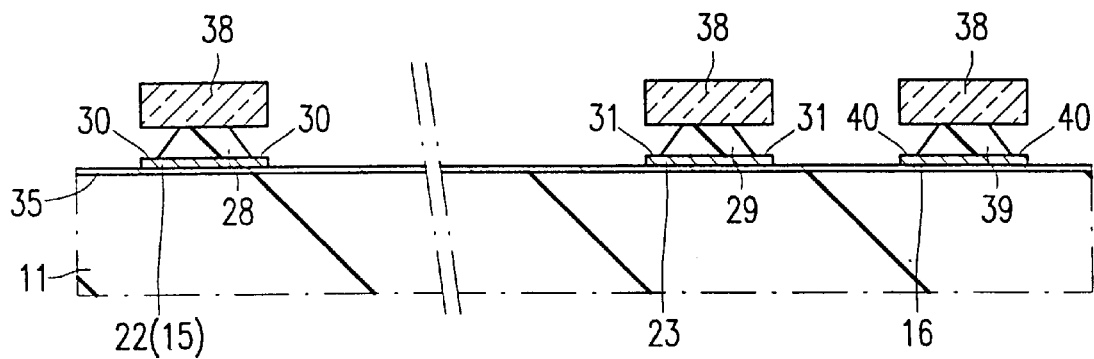
Figure 7:
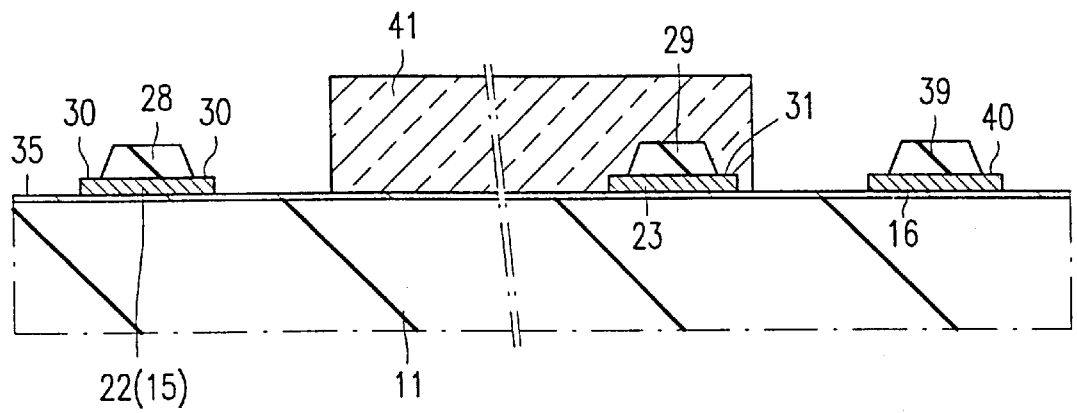
Figure 8:
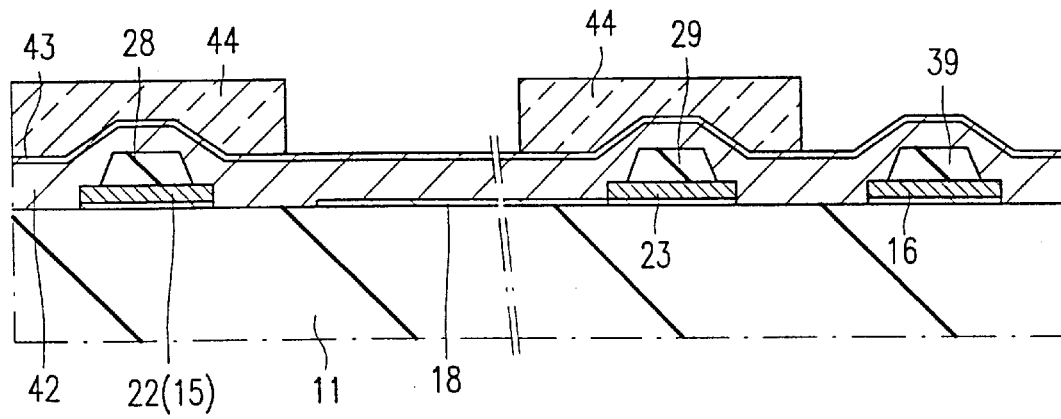
Figure 9:
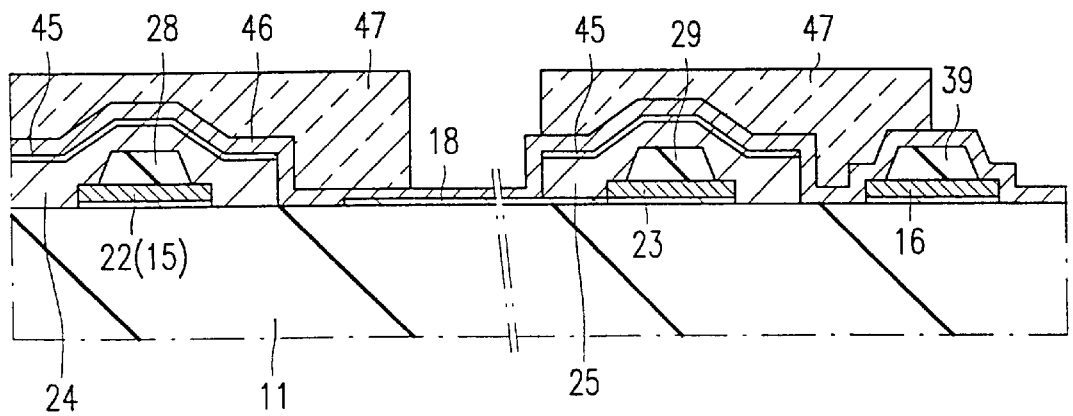
Figure 18:
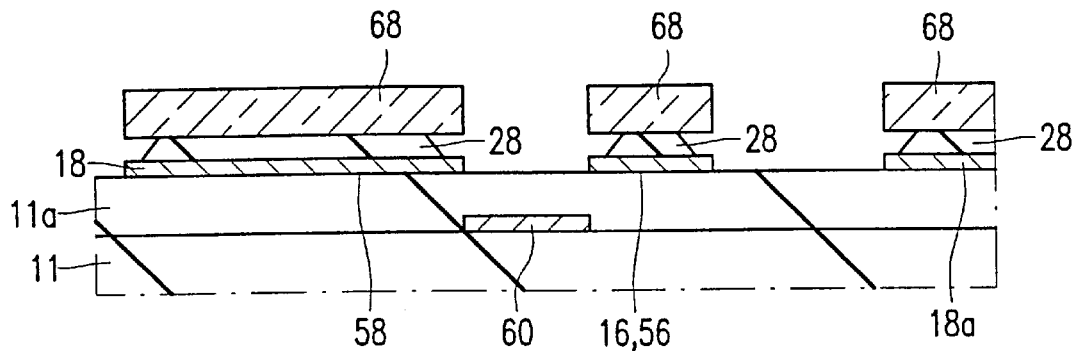

Etching stages similar to those for FIGS. 5 and 6 are then carried out to define the picture electrodes 18, tracks 16 and source and drain electrodes 56 and 58, each with an auxiliary oxide covering 28 which leaves their edges uncovered, as illustrated in FIG. 18. Unlike the situation of FIGS. 5 and 6, it should be noted that the area of the ITO picture electrode 18 also has an auxiliary covering 28 of the insulating material in FIG. 19. After removing the photoresist mask 68, the thin-film structure is exposed to a dopant-containing plasma, for example of phosphine ($PH_3$). As a result of this plasma treatment, conductivity-type determining dopant, for example, phosphorus is adsorbed at the uncovered edges of the ITO pattern 16,18,56 and 58.

A layer 42' of undoped α-Si:H semiconductor material (i.e with intrinsic conductivity, rather than n-type or p-type) is then deposited on the thin-film structure to provide the layer of switching material for the TFT. During this deposition the adsorbed dopant at the uncovered edges of the ITO pattern 16,18,56 and 58 diffuses into the layer 42' to provide doped regions ($n^+Si$) adjacent to these edges. These doped regions $N^+Si$ extend locally across the thickness of the layer 42'. The doped regions $N^+Si$ at the facing edges of the electrodes 56 and 58 form source and drain regions of the TFT, whereas the remaining undoped (intrinsic) area (i-Si) of the layer 42' therebetween forms the channel region of the TFT.

When the deposition of the layer 42' is complete, a thin layer 62' of insulating material, for example silicon nitride, is deposited to protect the surface of the silicon layer 42' and to provide part of the gate dielectric of the TFT. A planarising treatment similar to that of FIGS. 14 and 15 may then be carried out by forming on the thin-film structure a photoresist layer 50 with a smooth surface 51, and then etching back the exposed materials at the same rate until the silicon oxide auxiliary layers 28 are just exposed. The resulting structure is illustrated in FIG. 19.

A photoresist mask 70 is then formed on the planarised structure of FIG. 19 and is used as an etchant mask while etching through the layers 62', 42' and 28 to expose the ITO picture electrodes 18 and to define the TFT body for each pixel. The resulting structure is illustrated in FIG. 20, showing the TFT body with drain electrode 58 integrally connected to the exposed picture electrode 18 of that pixel. FIG. 20 also shows the edge 18a of the exposed picture electrode of the neighbouring pixel, which is separated from this TFT body and its picture electrode 18.

Figure 21:
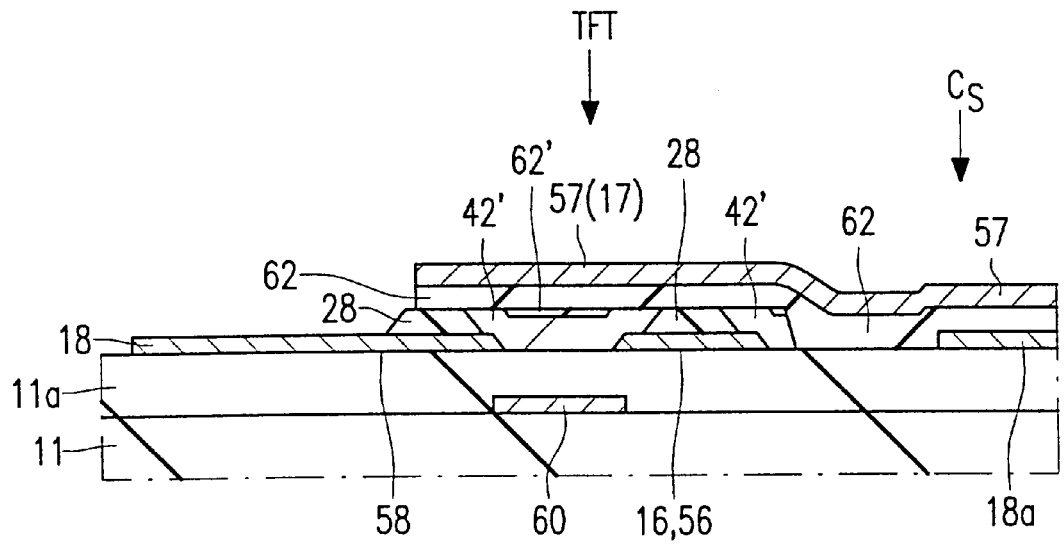
FIG. 21 is a diagrammatic cross-section of this fourth embodiment of the display device.

Subsequently a further insulating layer (for example of silicon nitride) and a conductive layer (for example of aluminium) are deposited and etch defined to provide the remaining gate dielectric part 62 and the gate electrode 57 of the TFT. By way of example, FIG. 21 illustrates the formation of a further thin-film circuit element by appropriate patterning of the insulating and conductive layers which provide the dielectric part 62 and electrode 57 of the TFT. In this case, an extension of these layers to overlie the edge 18a of the exposed picture electrode of the neighbouring pixel forms a storage capacitor $C_S$ for the neighbouring pixel. Furthermore, the row and column connections of a TFT matrix are different from those of a diode matrix. Thus, in the FIG. 21 embodiment of an active-matrix LCD device, the gate electrode 57 may be part of (or at least electrically connected to) a row conductor track 17 of the matrix, and the source electrode 56 may be part of (or at least electrically connected to) a column conductor 16 of the matrix. Thus, FIG. 21 illustrates an advantage of providing a thick auxiliary layer 28 on the electrode 56, in that this thick layer 28 reduces the parasitic capacitance between a crossing row conductor track 17 and the underlying column conductor track 16.

As illustrated in FIG. 21, the active plate 11 of the TFT-based active-matrix LCD device carries both the column and row conductor tracks 16 and 17. The passive plate 12 (which is not shown in FIG. 21, for simplicity in the drawings) carries a common picture electrode.

Figure 4:
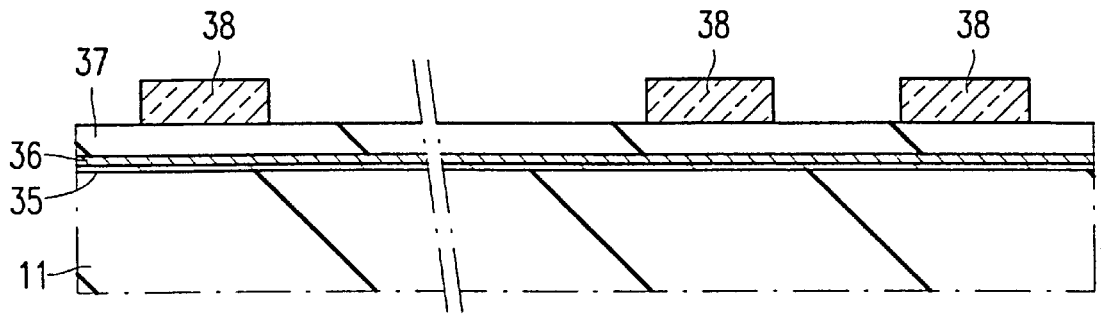
FIGS. 4 to 9 show in cross-section a few stages in the manufacture of the display device of FIGS. 2 and 3.

FIGS. 4 to 6 illustrate an advantageous process for etching back the insulating material 28 (by underetching a photoresist mask 38) to expose the edges 30, 31 and 40 of the first electrode pattern 22, 23, 15, 16. Alternative advantageous processes may be used, especially when the auxiliary layer 28 etc. is formed from a thick film 37 of an insulating polymer material. Thus, for example, a photoresist mask 38 may be used to etch define a pattern in the thick insulating polymer film 37 and electrode film 35, 66, and to leave a bevelled edge to the remaining thick insulating parts which provide the auxiliary layers 28 etc. The edges 30 etc. of the first electrodes may be then be uncovered by a general thinning of these remaining thick insulating parts by, for example, ion etching after first removing the photoresist mask 38. In a further modification, instead of requiring a separate photoresist mask 38, the thick film 37 may be of a photo-sensitive insulating polymer material.

As described above, electrodes and/or conductor tracks may be formed of ITO or another material (such as chromium nitride or a molybdenum chromium alloy) which can act as a dopant source after exposure to a dopant plasma. However long conductor tracks formed entirely of these materials may have an undesirably high resistance. To reduce this resistance, a track of higher conductivity may be included on the high resistance electrode, between the electrode and the auxiliary layer of insulating material. This track of higher conductivity may be completely covered by the auxiliary layer of insulating material.

The embodiments so far described with reference to FIGS. 1 to 21 are display devices. However, the invention may be used with thin-film switching elements in other large-area electronic devices, for example in image sensors. Thus, edge-only connection arrangements in accordance with the present invention may be adopted to modify the thin-film switching elements in the matrix pixels of such an image sensor and/or in the peripheral multiplexing circuits of such an image sensor, for example as a modification of the switching elements in the image sensor of U.S. Pat. No. 5,349,174. The whole contents of U.S. Pat. No. 5,349,174 are hereby incorporated herein as reference material.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalization thereof, whether or not it relates to the same invention as presently claimed in any claim and whether or not it mitigates any or all of the same technical problems as does the present invention.

What is claimed is:

1. An electronic device comprising thin-film switching elements on a substrate, each switching element including a layer of switching material between first and second electrodes, the layer of switching material lying on the first electrode on the substrate, and an auxiliary layer of insulating material between the first electrode and the layer of switching material, leaving only an edge of the first electrode uncovered, so that the layer of switching material is connected to the uncovered edge of the first electrode, wherein the layer of switching material is a semiconductor material including a doped region of one conductivity type.

2. A device as claimed in claim 1, wherein the auxiliary layer of insulating material leaves an edge uncovered on opposite sides of the first electrode.

3. A device as claimed in claim 2, wherein the layer of switching material is provided on the uncovered edge of the first electrode at only one of the sides of the first electrode.

4. A device as claimed in claim 3, wherein the layer of switching material is present above the edge of the first electrode but not on top of the auxiliary layer of insulating material.

5. A device as claimed in claim 2, wherein the layer of switching material is present above the edge of the first electrode but not on top of the auxiliary layer of insulating material.

6. A device as claimed in claim 1, wherein the layer of switching material is present above the edge of the first electrode but not on top of the auxiliary layer of insulating material.

7. A device as claimed in claim 1, wherein the substrate provides one of two parallel support plates of a display device, mutually facing faces of the parallel plates carry picture electrodes of the display device, the switching elements are accommodated between conductor tracks on said one plate and the picture electrodes of said one plate, and an electro-optical display medium is provided between the parallel support plates.

8. A method of manufacturing an electronic device comprising thin-film switching elements formed on a substrate which method comprises forming a first electrode on the substrate for each switching element, and providing a layer of switching material on said first electrode, wherein an auxiliary layer of insulating material is formed on the first electrode before the switching material is provided, leaving only an edge of the first electrode uncovered, and subsequently the switching material is provided both on the insulating auxiliary layer and on the uncovered edge of the first electrode, wherein semiconductor material is deposited to provide the layer of switching material, and dopant of one conductivity type is diffused into the semiconductor material from the uncovered edge of the first electrode to provide the switching element with a doped region of one conductivity type.

9. A method as claimed in claim 8, wherein the layer of switching material is removed from on top of the auxiliary layer of insulating material formed on the first electrode, before a second electrode is formed on the layer of switching material.

10. A method as claimed in claim 8, wherein the substrate provides one of two parallel support plates of a display device, mutually facing faces of the parallel plates carry picture electrodes of the display device, the switching elements are accommodated between conductor tracks on said one plate and the picture electrodes of said one plate, and an electro-optical display medium is provided between the parallel support plates.

11. A method of manufacturing an electronic device comprising thin-film switching elements formed on a substrate which method comprises forming a first electrode on the substrate for each switching element, and providing a layer of switching material on said first electrode, wherein an auxiliary layer of insulating material is formed on the first electrode before the switching material is provided, leaving only an edge of the first electrode uncovered, and subsequently the switching material is provided both on the insulating auxiliary layer and on the uncovered edge of the first electrode, wherein the layer from which the first electrode is formed is covered with a layer of insulating material, on which a photoresist mask is then provided, and both layers are subsequently etched into a pattern, the layer of insulating material being removed from the edge of the first electrode by etching back the insulating material, thereby forming the auxiliary layer leaving an edge of the first electrode uncovered.

12. A method as claimed in claim 11, wherein the auxiliary layer of insulating material is etched isotropically and the layer of conductive material is etched anisotropically into the relevant pattern, the auxiliary layer of insulating material being removed from the edge of the first electrode through underetching the photoresist mask using the isotropic etching process.

\* \* \* \* \*